(12) United States Patent
Pan et al.

(10) Patent No.: US 10,520,527 B2
(45) Date of Patent: Dec. 31, 2019

(54) MINIATURE DEVICE FOR ULTRA HIGH SENSITIVITY AND STABILITY PROBING IN VACUUM

(71) Applicants: The Regents of the University of California, Oakland, CA (US); The Regents of the University of Michigan, Ann Arbor, MI (US)

(72) Inventors: Xiaoqing Pan, Irvine, CA (US); Thomas F. Blum, Irvine, CA (US); Mingjie Xu, Irvine, CA (US); Jake Jokisaari, Ann Arbor, MI (US); Wilbur Bigelow, Ann Arbor, MI (US)

(73) Assignees: The Regents of the University of California, Oakland, CA (US); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 16/221,998

(22) Filed: Dec. 17, 2018

(65) Prior Publication Data

US 2019/0187174 A1    Jun. 20, 2019

Related U.S. Application Data

(60) Provisional application No. 62/599,239, filed on Dec. 15, 2017.

(51) Int. Cl.
*H01J 37/285* (2006.01)
*H01J 37/244* (2006.01)
*H01J 37/20* (2006.01)
*G01Q 60/16* (2010.01)

(52) U.S. Cl.
CPC ............. *G01Q 60/16* (2013.01); *H01J 37/20* (2013.01); *H01J 37/244* (2013.01); *H01J 37/285* (2013.01); *H01J 2237/244* (2013.01)

(58) Field of Classification Search
CPC ........ H01J 37/20; H01J 37/244; H01J 37/285; H01J 2237/244
See application file for complete search history.

(56) References Cited

U.S. PATENT DOCUMENTS

| | | | |
|---|---|---|---|
| 5,124,645 A * | 6/1992 | Rhoden ............... | G01R 1/0416 250/442.11 |
| 2004/0094710 A1 * | 5/2004 | Muller ................... | H01J 37/20 250/306 |
| 2006/0022135 A1 * | 2/2006 | Moore .................... | H01J 37/20 250/309 |
| 2006/0249687 A1 * | 11/2006 | Chao ....................... | H01J 37/20 250/441.11 |
| 2006/0289784 A1 * | 12/2006 | Deguchi ................ | G01N 23/06 250/441.11 |

(Continued)

*Primary Examiner* — Nicole M Ippolito
*Assistant Examiner* — Sean M Luck
(74) *Attorney, Agent, or Firm* — Nguyen Tarbet

(57) ABSTRACT

The present disclosure relates to in situ transmission electron microscope (TEM) holders with improved stability and electrical sensitivity. The holders feature a front bearing seal and a rear bearing seal which allow the holders to achieve high sensitivity, high stability, large range of motion and high vacuum isolation. The bearings use a PEEK insulating disk as a pivot point for translation and tilting motion, and use O-rings to dampen vibrations, provide electrical and vacuum insulation, and to set a grabbing force between the bearing and the probe.

20 Claims, 7 Drawing Sheets

(56) References Cited

U.S. PATENT DOCUMENTS

| | | | | |
|---|---|---|---|---|
| 2012/0293791 A1* | 11/2012 | Milas | ............... | H01J 37/20 |
| | | | | 356/72 |
| 2014/0158907 A1* | 6/2014 | Hamochi | ............ | H01J 37/26 |
| | | | | 250/442.11 |
| 2015/0243472 A1* | 8/2015 | Kikuchi | ............ | H01J 37/26 |
| | | | | 250/441.11 |

\* cited by examiner

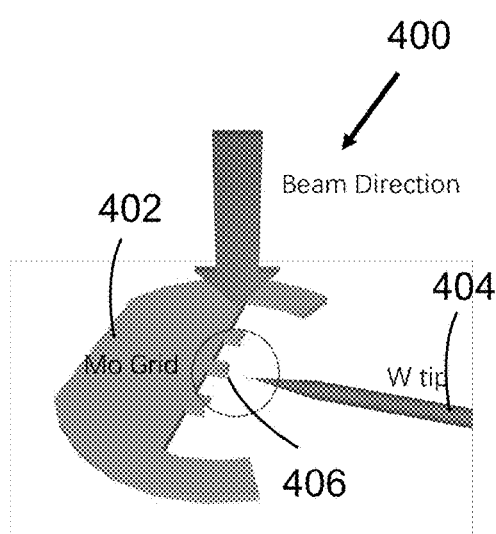
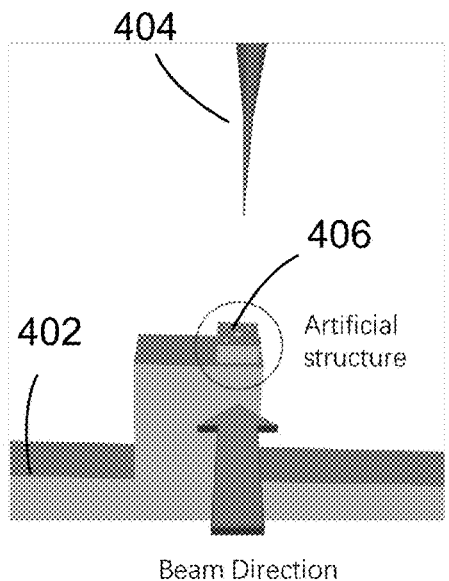
FIG. 4A  FIG. 4B
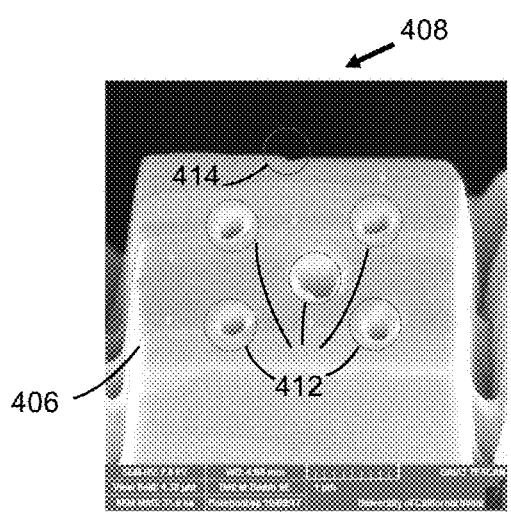
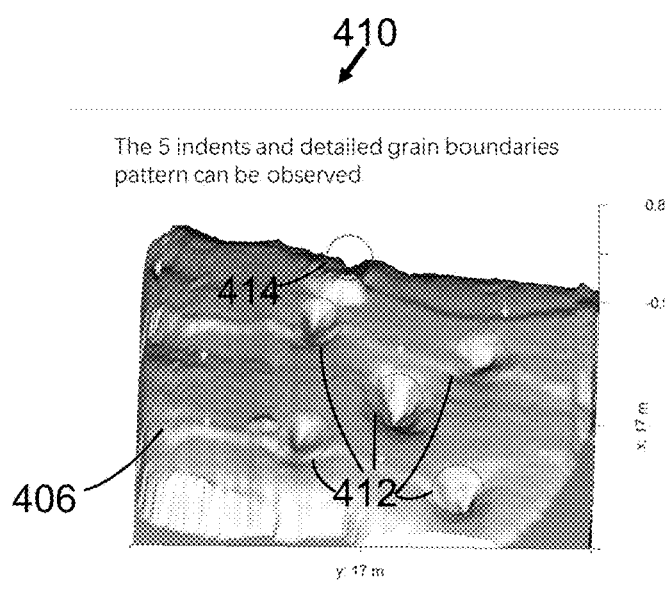
FIG. 4C  FIG. 4D

MINIATURE DEVICE FOR ULTRA HIGH SENSITIVITY AND STABILITY PROBING IN VACUUM

CROSS-REFERENCES TO RELATED APPLICATIONS

This application is a non-provisional application and claims benefit of U.S. Provisional Patent Application No. 62/599,239, filed Dec. 15, 2017, the specification(s) of which is/are incorporated herein in their entirety by reference.

STATEMENT REGARDING FEDERALLY SPONSORED RESEARCH OR DEVELOPMENT

This invention was made with government support under Grant No. DE-SC0014430 awarded by DOE/BES. The government has certain rights in the invention.

FIELD OF THE INVENTION

The present invention relates to in situ transmission electron microscope (TEM) holders, or more specifically, to TEM holders that perform under improved stability and electrical sensitivity.

BACKGROUND OF THE INVENTION

The development of electron microscopy has made real time or in situ observation of physical phenomena under microscopic scale possible. With transmission electron microscopes (TEM), such phenomenon may be examined on an atomic level. Experimental setup has been developed to allow variables, such as gas environment, temperature, electrical biasing, and mechanical force, to be introduced and controlled in real time. Most in situ specimen holders are built with singular functionality. However, the demand to push to incorporate multiple functions into a single holder has grown recently, for that most events are affected by multiple variables. It is also worth noticing that most of the conventionally available holders only have single-tilt capability, meaning that the ability to achieve high resolution imaging on these holders are limited.

For in situ experiments involving electrical measurements in the TEM, electrodes are typically deposited on the samples and are further wired to the electrical feeds before placing the specimen holder into the TEM. This enables capacity type of electrical field input and is suitable for experiments that needs uniform electrical field. The electrodes are deposited using a focused ion beam (FIB) or by sputtering the electrodes onto the surface of the specimen. Thus, the electrodes cover a larger area on the sample surface making it more difficult for localized biasing and electrical measurements. In addition, for performing biasing/measurement experiments, a probe may be manipulated to make contact with a specific point on the sample. As the manipulation system takes a significant amount of the space, the TEM holders typically have singular functionality and cannot ensure both high sensitivity and high stability.

In some examples, chip-based microelectromechanical systems (MEMS) may be used in the TEM holders. These designs miniaturize the electrical components and integrate them on to a single-use silicon-based chip that has an electron transparent SiN window for observation. However, such systems are limited by the type of the samples that can be used. It may be difficult to mount a thin film sample. Additionally, the ability for dynamic methods such as manipulation of probes and illumination may be limited. As a result, these MEMS holders may not suitable for thin film characterizations.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The object of the present disclosure is to provide a TEM holder that allows the ultra-high stability and sensitivity electric probing experiments. For example, the ultra-high sensitivity electric probing experiments enables I-V measurement with the resolution up to 1 pA, and scanning tunneling microscopy (STM) can be realized in TEM when combined with the ultra-high stability feature of the design.

The present invention relates to integrating a TEM holder with multiple functionalities, while still maintaining high performance. One challenge is to fit a complete manipulation component, a fiber optic component, and a double tilting component into a single specimen rod, while the front part can still fit in the polepiece gap of the TEM. Generally, the point-to-point resolution decreases as the polepiece gap increases. For ultra-high-resolution (UHR) polepiece, the gap is too small for most in situ holder to fit in. The present invention, when integrated with double tilt function and optical component can fit in the UHR polepiece.

Maintaining insulation between the electrical component and the TEM rod may be challenging. In in situ TEM experiments, the sample must be float with respect to rod because the potential between the rod and the goniometer is used to determine whether the rod is fully inserted in place. Additionally, the sample stage must be conductive so that the localized charging effect from the electron beam is minimized. In present disclosure, the sample is insulated with respect to the holder while still maintaining double tilt function and high sensitivity.

One of the unique and inventive technical features of the present invention is that it achieves high vacuum isolation, improved stability, sensitivity and probing region compared to the commercialized devices. Because the in situ TEM holder is inserted between the pole pieces inside the column of the TEM, which has very limited space and is under high vacuum, it is extremely difficult to ensure high performance of the sealing component which protects the vacuum, the vibration damping component which stabilizes the probe and sample, and the electronics component which affects the sensitivity, at the same time while still maintaining large probing region. The in situ holder equipped with the unique and compact design of the present invention can however achieve excellent stability and sensitivity compared to current products. The key component to achieve such performance involves a set of Viton O-rings and a miniature PEEK insulating disk. The hollow disc has an internal and an external o-ring groove and sits inside the front end of the holder. The STM component passes through the center of the hollow disk and can move freely against it. With the back side of the STM component sealed in a similar design, the STM component is well insulated by the PEEK disk from both electric current and air; In addition, the PEEK insulating disk provides the STM component with a pivot point for translation and tilting motion. Finally, the O-rings that separate the STM components from the rest of the holder generate adequate damping for high frequency vibration. This miniature PEEK insulating disc and the o-ring set gives a unique approach to achieve high sensitivity, high stability, large range of motion and high vacuum isolation at the same time, which is not possible using previous designs.

BRIEF DESCRIPTION OF THE DRAWINGS

The features and advantages of the present invention will become apparent from a consideration of the following detailed description presented in connection with the accompanying drawings in which:

FIG. 4A shows an illustration of STM tomography mapping.

FIG. 4B shows an illustration of STM tomography mapping of an artificial feature.

FIG. 4C shows an SEM image of a mapping feature with indents and grain boundaries.

FIG. 4D shows an SEM image of a mapping feature in which 5 indents and detailed grain boundaries pattern can be observed.

DESCRIPTION OF PREFERRED EMBODIMENTS

Figure 1A:
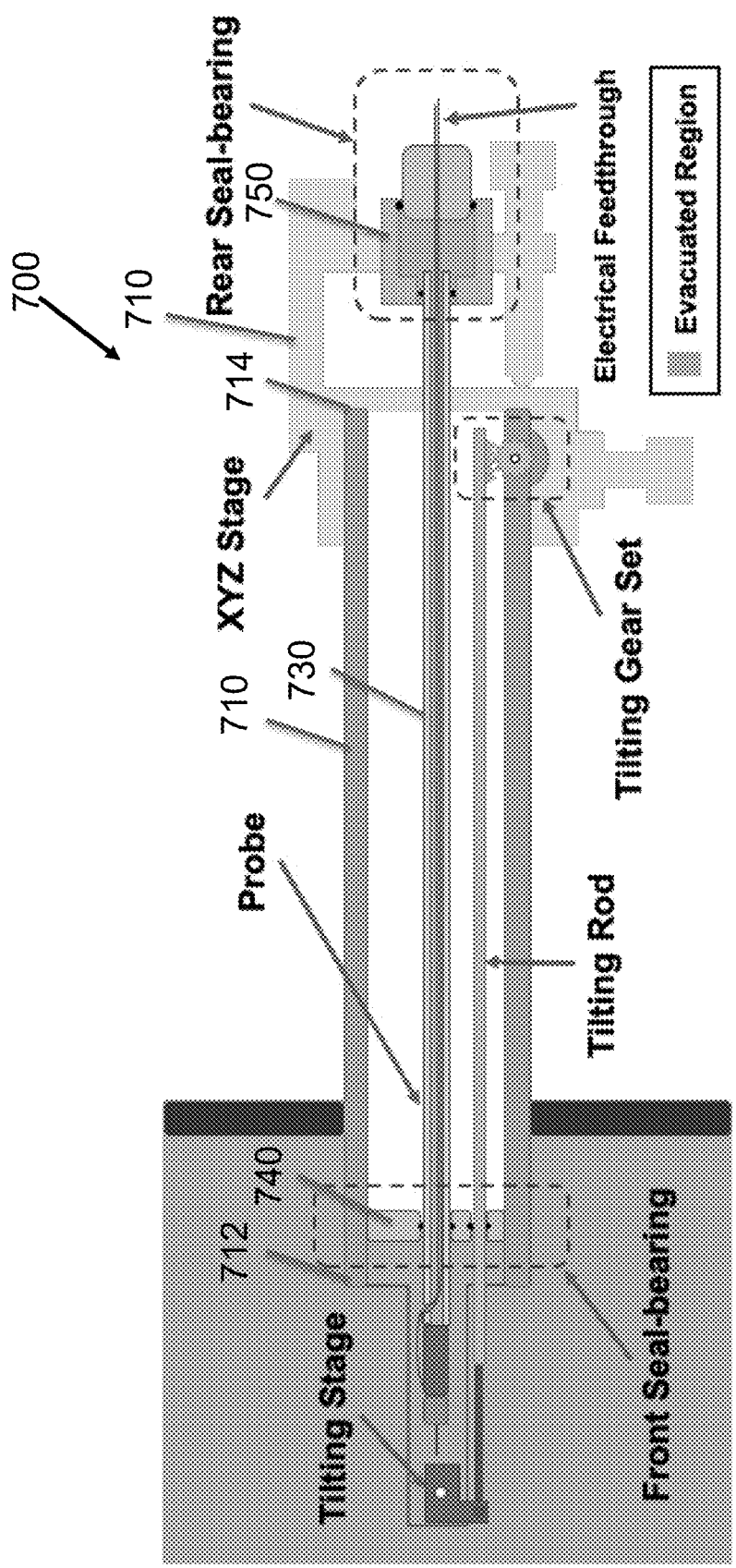
FIG. 1A shows a schematic illustration of the parts of an in situ TEM holder of the present invention.

Following is a list of elements corresponding to a particular element referred to herein:
100 schematic diagram
102 sample holder
104 TEM sample laminar
106 electron beam
108 electrical probe
110 optical fiber
112 thin film sample
114 optical beam
116 TEM chamber
118 probing configuration
200 3D modelling image
202 TEM holder
204 sample holder
206 probe holder
208 probe assembly
209 o-ring
210 base holder
211 PEEK hollow disk
212 linear stage manipulator
213 grooves
214 sample stage region
216 back panel
250 magnified view
252 electrical or STM probe
254 piezo tube
256 probe Mount
275 photo
276 electrical wire
278 electrical wire
300 image
302 adjuster screws
304 inlets
308 insulating base
400 STM mapping procedure
402 Molybdenum half grid
404 STM probe
406 STM mapping feature
408 SEM image
410 STM image
412 indents
414 grain boundary
500 series
502 marker of enlarged region
504 tungsten tip
506 CZTSe sample
600 TEM image
602 TEM holder
604 optical probe holder
606 housing
608 o-ring
610 optical source
612 knobs
614 knobs
650 magnified view
652 brass tubing
654 stage holder
656 optical fiber
658 optical element
700 probe assembly
710 probe holder assembly
712 front end
714 rear end
720 probe manipulator
725 piezo tube
730 probe
740 front bearing
742 front insulating disk
743 through-hole
744 internal O-ring groove
745 front O-ring
750 rear bearing
752 rear insulating disk
753 through-hole
754 internal O-ring groove
755 rear O-ring
760 bearing
762 insulating disk
763 through-hole
764 internal O-ring groove
765 O-ring As used herein, "deformation" refers to the change of shape of a material under compressive force. As a non-limiting example, an O-ring experiences deformation when the gap between the inner and outer surface is smaller than the cross-sectional diameter of the O-ring. This diametrically squeezes the seal, and the resulting force ensures surface contact with the inner and outer walls. One way to measure deformation is to compare the uncompressed diameter of the O-ring with the size of the gap which the O-ring is compressed to fill. For example, if an O-ring with an uncompressed diameter of 1.0 mm is squeezed into a 0.8 mm gap, the O-ring will experience a deformation of 20 percent.

Referring now to FIGS. 1-6, the present invention features an in situ TEM holder integrated with a stage holder and a probe holder, each of which is configured with double tilting mechanism. Herein, the probe may include one or more of an electrical probe and an optical probe.

Figure 1B:
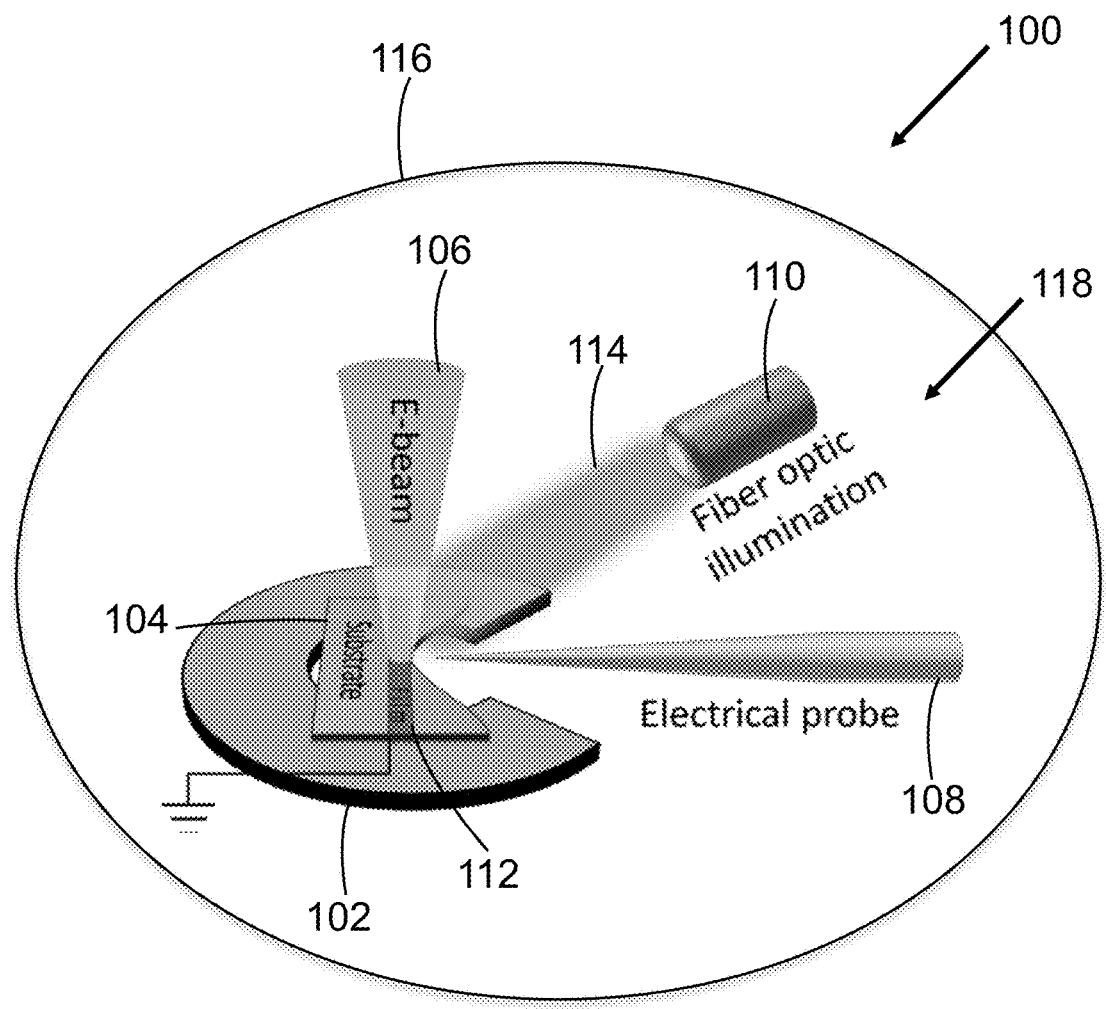
FIG. 1B shows a schematic diagram of a transmission electron microscope (TEM) imaging set-up integrated with optical probe and an electrical probe.

Turning now to FIG. 1B, schematic diagram 100 shows a transmission electron microscopy (TEM) imaging set-up integrated with a probing configuration 118. In one example, the probing configuration 118 may include an optical fiber 110 and an electrical probe 108. TEM is an imaging technique in which an electron beam 106 is transmitted through a specimen or sample 112 and form a phase contrast image. As such, the thin film sample 112 is mounted on a specimen or sample holder 102 that is inserted into a TEM chamber 116 using a TEM holder. For example, the thin film sample 112 may be a thin film embedded in a TEM Sample laminar 104, which is then mounted on the sample holder 102. Typically, in situ TEM holders are built with singular functionality. However, the inventors have recognized that it may be desirable to extend the functionality of the TEM holder and to incorporate multiple functions into a single holder as shown in FIG. 1B.

In one example embodiment, the TEM holder may be integrated with one or more of the electrical probe 108 and the optical fiber 110. The sample holder 102 may be a double-tilt holder. As such, the double tilting functionality of the sample holder 102 may increase the flexibility of orienting the thin film sample 112 relative to the electron beam 106. In addition to generating TEM images of the thin film sample 112, it may be possible to apply a bias to a region of interest of the thin film sample 112 using the electrical probe 108 (as explained further below with reference to FIGS. 2 A-C, 3 A-B, 4 A-C, and 5). In some example embodiments, the optical fiber 110 may be used to illuminate the thin film sample 112 with an optical beam 114 while generating the TEM image of the thin film sample 112 using the electron beam 106. In one example, the optical fiber 110 may be an optical fiber coupled to a source (e.g., laser, LED) that generates the optical illumination 114 which may then be used for photovoltaic measurements in the thin film sample 112. In this way, by integrating electrical and optical probes into the TEM holder, it may be possible to characterize nanoscale defects such as small phase aggregation inside the thin film sample 112 and the grain boundaries for polycrystalline thin film specimens, for example.

Figure 2A:
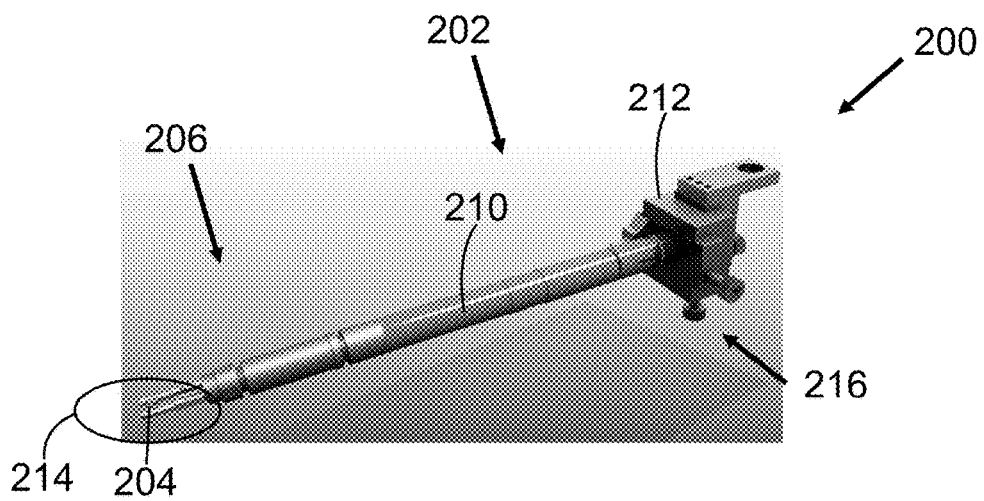
FIG. 2A shows an example 3D modelling image of an in situ TEM holder having a sample holder and a probe holder coupled to a linear stage.

Turning now to FIG. 2A, a 3D modelling image 200 of an in situ TEM holder 202 having a sample holder 204 and a probe holder 206 is shown. In a first example embodiment, the probe holder 206 may be an electrical probe holder having an electrical probe, such as a STM probe. As such, the STM probe may be used to apply an electrical bias to a specimen mounted on the sample holder 204. The probe holder 206 may be interchangeably referred to as electrical holder and STM holder. In a second example, the probe holder 206 may be an optical probe holder having an optical probe, such as an optical fiber.

Figure 2B:
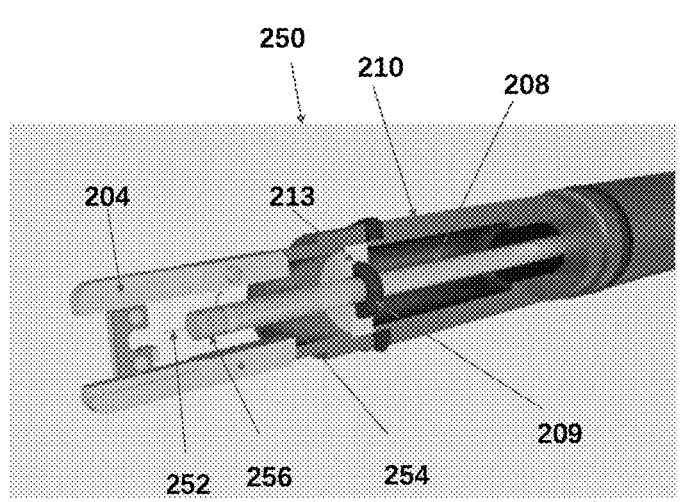
FIG. 2B shows a 3D modeling image of the front end of the in situ TEM holder including the probe assembly and the front seal bearing.

The probe holder 206 may include a probe assembly 208 enclosed inside a base holder 210. A first end of the base holder 210 may be coupled to the sample stage 204, and a second, opposite end of the base holder 210 may be coupled to a linear stage manipulator 212. A magnified view 250 of a sample stage region 214 is shown in FIG. 2B. Turning to FIG. 2B, the probe assembly 208 may include a piezo tube 254 and a probe mount 256. An electrical or STM probe 252 may be mounted on the front end of the probe assembly 208. Specifically, the STM probe 252 may be mounted inside the probe mount 256 and further insulated from the piezo tube 254, as discussed further below with reference to FIG. 3B. In one example, the diameter of the probe assembly 208 may be ⅛ inch. The STM probe 252 inserted into the probe assembly 208 may extend for a distance towards the sample holder 204 as shown in view 250. The STM probe holder 206 is sealed and positioned concentrically within a hollow PEEK disk 211. In one non-limiting example, the hollow disk is composed of polyether ether ketone (PEEK), and hereafter may also be referred to as PEEK hollow disk. Specifically, the probe 252 passes through a center of the PEEK hollow disk 211. The PEEK hollow disk has internal and external o-ring grooves 213 fitted with O-rings 209 and additionally the hollow disk sits inside a front end of the holder. The STM probe 252 passes through the center of the hollow disk 211 and can move freely against it. In addition, a back side of the STM component is also sealed in a similar fashion (e.g., with O-rings fitted on grooves in the disk). In this way, the STM component or probe 252 is well insulated by the PEEK hollow disk from both electric current and air. Thus, the present design of the TEM holder provide high stability and high vacuum isolation of the STM probe. Additionally, the PEEK hollow disk provides a pivot point for both translation and tilting motion of the STM probe 252. Thus, the TEM holder with the STM probe has a large range of motion. In one non-limiting example, the O-rings 209 may include Viton O-rings. In addition, the O-rings that separate the STM components from the rest of the holder generate adequate damping for high frequency vibration. In this way, the miniature PEEK hollow disk and the o-ring set gives a unique approach to achieve high sensitivity, high stability, large range of motion and high vacuum isolation at the same time, which is not possible using previous designs.

Figure 2C:
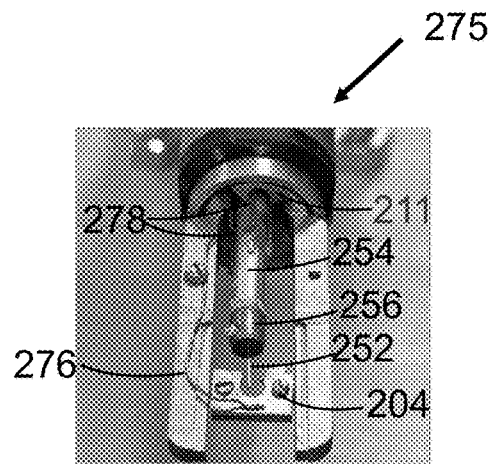
FIG. 2C shows a photo of the sample stage region.

A specimen (not shown in FIG. 2B) may be mounted on the sample holder 204. Additionally, a bias voltage may be applied between the STM probe 252 and the specimen. In order to apply a voltage bias, electrical wires may be soldered to the sample stage as shown in FIG. 2C. Turning to FIG. 2C, a photo 275 of the sample stage region 214 shows an electric wire 276 soldered to the sample holder 204. When the STM probe 252 is brought within about 10 Å of the specimen, electrons from the specimen may begin to "tunnel" through the 10 Å gap into the probe or vice versa, depending upon the sign of the bias voltage. In this way, the STM probe 252 may be used to apply a bias to the specimen and the specimen may be imaged with the electron beam (as explained earlier with reference to FIG. 1B) to generate TEM image during the biasing.

In some example embodiments, both the specimen and the STM probe may be tilted and the orientation of the specimen relative to the STM probe and vice versa may be adjusted. For double tiling the specimen, the stage holder 204 may include a double tilt function. In one example, the double-tilt stage holder may be adjusted by a push rod that is located on the back panel of the stage holder. In such an example, the push rod may be coupled to the sample stage holder by a material that is composed of a highly elastic wire. In one non-limiting example, the material may be composed of a NiTi alloy (Nitinol). Some of the properties of the Nitinol wire include light weight, passive, highly elastic, and high resistance to abrasion.

The position of the STM probe 252 within the probe assembly 208 may be adjusted using a mechanical coarse approach system and a piezo scanner for the fine motion/scanning. The mechanical coarse motion may include a "wobble stick" design, where the probe assembly 208 serves as a wobble stick. The wobble stick passes through an o-ring seal in the front part of the holder that serves as both a vacuum seal and a pivot point. The coarse tip motion is controlled by the linear stage manipulator 212 that is mounted to one end of the base holder 210 of the probe holder 206. An image 300 of the linear stage 212 is shown in FIG. 3A.

Figure 3A:
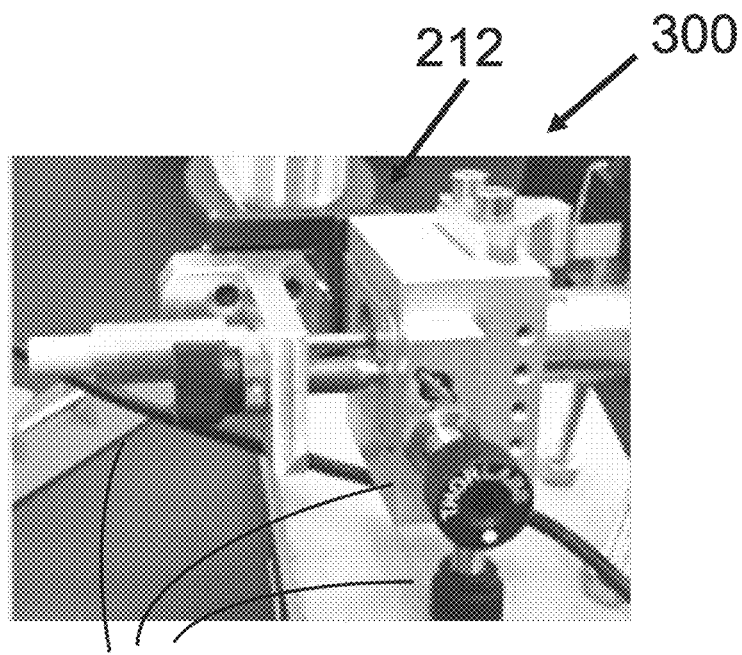
FIG. 3A shows an image of the linear stage coupled to the TEM holder.

Turning to FIG. 3A, the linear stage 212 includes three adjuster screws 302 that may be adjusted to adjust the x, y, and z position of the linear stage manipulator 212. By adjusting the position of the linear stage 212, the position of the STM probe may be adjusted. For example, when the screws 302 of the linear stage manipulator 212 is adjusted along y+/z+ direction, the STM probe 252 may be deflected towards y−/z− direction. Likewise, when the screws 302 of the linear stage 212 is adjusted the x direction, the wobble stick will slide along the o-ring seal and move to the same direction. In one example embodiment, the differential adjuster screws 302 may have a 25 µm/rev resolution. In such an embodiment, when combining the reduction of the motion by having a pivot point at the o-ring seal, the coarse motion resolution may achieve 10 nm in y/z direction and 150 nm in x direction.

Figure 3B:
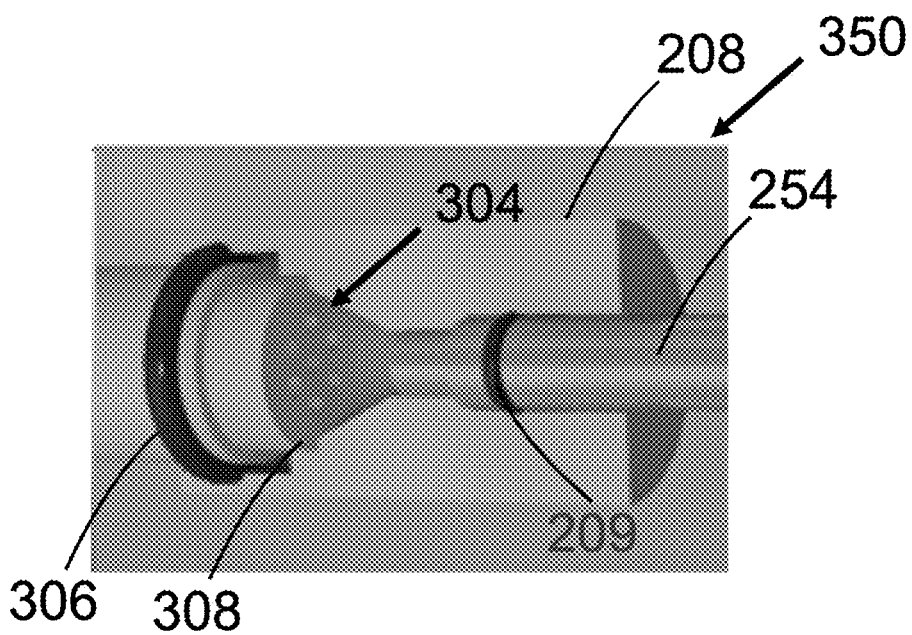
FIG. 3B shows a cross-sectional view of a back seal of the probe component.

As can be seen from FIG. 3B, seven inlets 304 for inserting seven electrical wires, including five for controlling the piezo scanner and a twist pair of biasing/sensing cables pass through the probe assembly 208, and are individually sealed at a specially designed feedthrough with vacuum epoxy. The feedthrough component is sealed by o-ring 306 against the wobble stick or probe assembly 208 so that the entire interior of the wobble stick is under vacuum when the holder is inserted into the TEM. Such back-sealing mechanism ensures the best insulation across the seven electrical wires inserted into the inlets 304 and provide possibility of modifying and repairing the electronic components. The time required for the holder to be pumped down to 10-5 torr is also significantly shorter compared to the design that pumps the entire interior of the holder. In some examples, the TEM holder may be in maintained in vacuum when not in use to reduce any degassing.

Five electrical wires (such as electrical wires 278 shown in FIG. 2C) of the seven electrical wires are coupled to the piezo scanner that is used for controlling the fine motion of the STM probe 252. The fine motion drive is the PZT piezo tube 254 that allows sub-nanometer spatial resolutions for positioning and STM scanning within the TEM. The piezo tube 254 (or interchangeably referred to as scan tube) is mounted on an insulating base 308 which connects it to the mechanical coarse motion system. The piezo tube 254 has four quartered electrodes and a center electrode and can be driven by a SPM scan controller. In one example embodiment, the piezo tube may be connected to a Nanosis SPM scan control system from SPECS. This allows both fine positioning and STM scanning to be carried out. The STM probe 252 may be mounted in the probe mount 256, insulated from the piezo tube 254. The STM probe voltage and stage sense wires are carried by twisted pair shielded wire that is completely separated from the piezo drive electrics in order to reduce crosstalk between the scan and bias voltages.

In order to effectively image single-crystal film specimens, a double-tilt holder may be desired. The tiltstage may be also actuated by a mechanical mechanism constructed similar to the coarse-motion approach system as described previously. The double-tilt system may be driven by a rod arrangement mounted to another spring-loaded micrometer at the rear of the specimen rod. The fine motion may be controlled by a ⅛" by ½" PZT tube. The exterior gold contact has been divided into 4 quadrants. These quadrants correspond to bending the PZT tube to x+, x−. y+ and y− directions.

The travel range of the fine motion is about 5 µm in y and z direction and 500 nm in x direction. Since the travel range of the fine motion is larger than the resolution of the coarse resolution, the tip may be able to reach to any coordinate with the combination of the two systems. When performing the coarse motion by hands, however, some vibration may be introduced to the tip through the screw. Such vibration may make the z-motion unstable because the resolution of the tip moving along x-y plane is about ten times higher than that along z-direction. One way to increase the stability of the coarse motion along z direction is to increase the diameter of the knob. In doing so the torque that is applied to the screw is better controlled. Another way is to combine these knobs with piezo stacks. The combination of the micrometer and a piezo stack may achieve a much finer travel resolution in a larger scope. In one example embodiment, with the Thorlab PE4 adjuster, one can achieve 4 mm travel of coarse motion using a 0.01" pitch leadscrew, and 15 µm total travel of intermediate motion using the piezo stack. The introduction of a piezo stack fills the gap between the coarse and fine motion along the z-direction and hence makes the tip adjustment much easier.

In one example, the TEM holder 202 explained with reference to FIGS. 2A-C and 3A-B may compatible with the Nanosis SPM controller. When controlled by this controller, the TEM holder 202 may perform high sensitivity current measurement down to 10-11 A. Given such sensitivity, the holder may be equipped with an automatic approaching mechanism that may be controlled by the tunneling current feedback. When the STM probe 252 is moved within the range of the piezo motor range, the system may expand the piezo tube 254 when the tunneling current is low, implying that the STM probe is still far from the sample. However, when the tunneling current exceeds a certain threshold, the piezo tube will contract to bring the current down, indicating that the STM probe has reached the sample. In this way, the TEM holder may be integrated with the STM probe to perform in situ electrical probing of the specimen mounted within the TEM chamber. Some example experimental procedures using STM probe integrated with the TEM holder is shown in FIGS. 4A-C and FIG. 5.

FIGS. 4A-D show an example STM tomography mapping procedure 400 that demonstrate high stability feature of the present invention. Specifically, the STM tomography mapping is performed using a STM probe 404 integrated with a TEM holder (such as the TEM holder 202 of FIG. 2A) on a Molybdenum half grid 402. Herein, the STM probe 404 may be one non-limiting example of the STM probe 252 shown in FIGS. 2B and 2C. As an example, the STM probe 404 may be composed of tungsten W. As such, the topography information may be calculated by recording the voltage applied to a piezo tube (such as the piezo tube 254 of FIGS. 2B and 2C) during the scanning process as the STM probe 404 records the value of voltage applied to the piezo tube that maintains the tunneling current of 100 pA. Using such mapping technique, one can map the topography by scanning the tip along the y-z plan without the risk of touching/damaging the film. FIG. 4A and FIG. 4B show the schematics of the STM setup, where an artificial feature is made on top of the center pillar of a Mo half grid 402. FIG. 4C and FIG. 4B show that, by comparing the SEM image 408 with the STM image 410 of the artificial feature 406, the topography mapping 406 contains the exact same details observed by SEM image 408. Herein, indents 412 and grain boundary patterns 414 on the SEM image 408 may also be observed in the STM image 410.

Figure 5:
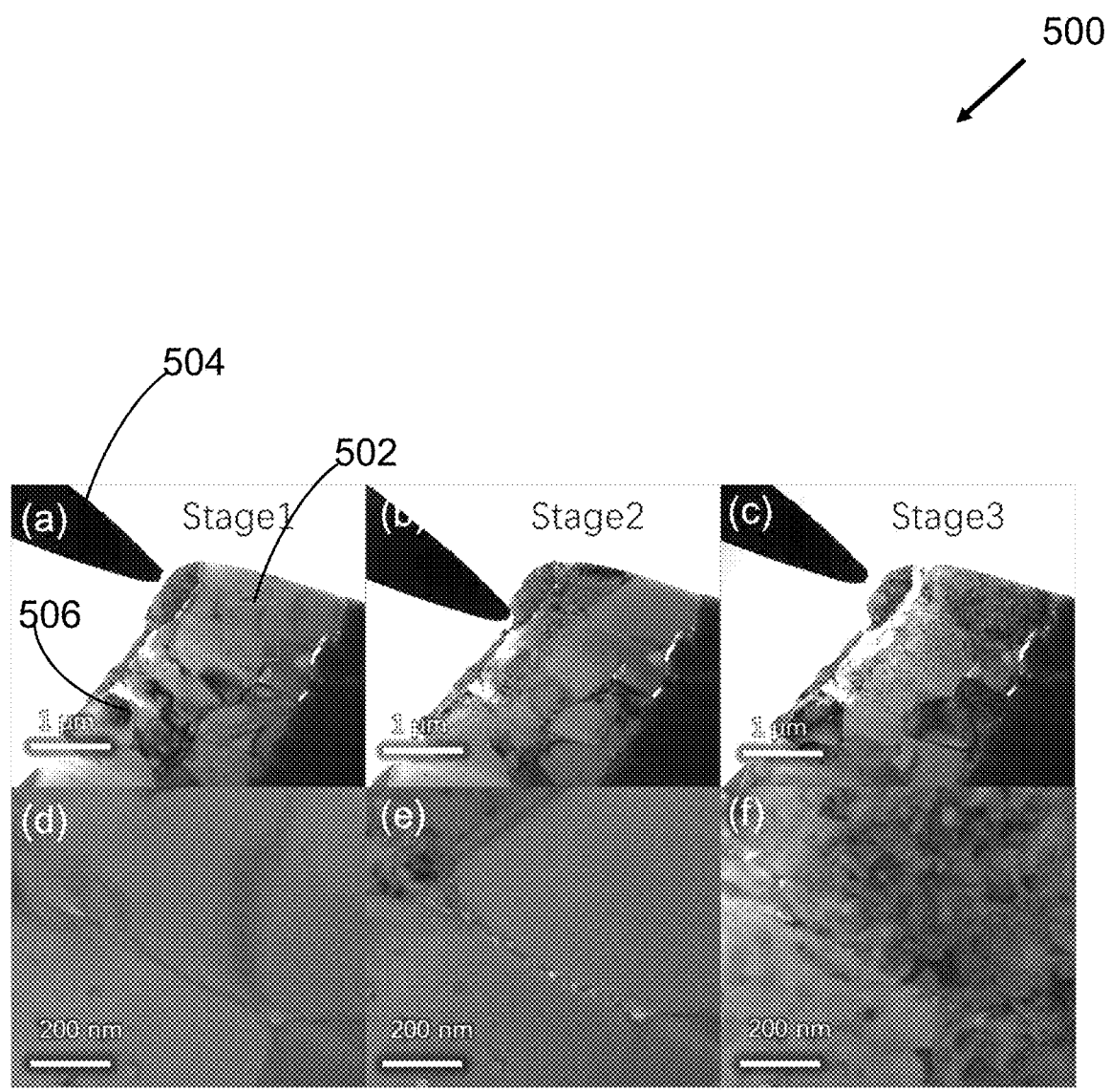
FIG. 5 shows in situ biasing of polycrystalline copper-zinc-tin-selenide (CZTSe) device using the STM probe. (a) to (c) are TEM BF images of different stages during the in situ biasing of CZTSe. (d) to (f) are enlarged TEM BF images of the highlighted region in (a).
Figure 6:
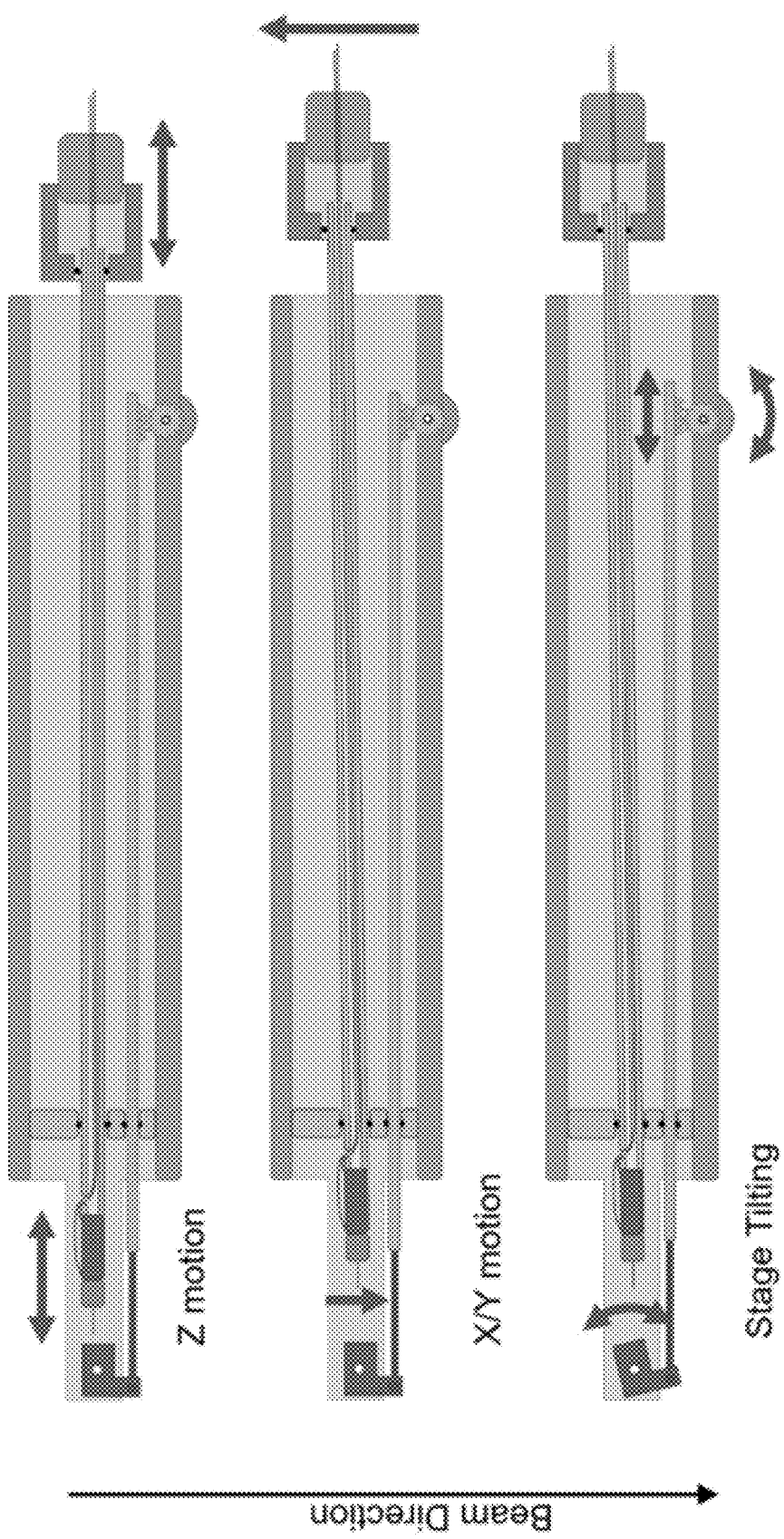
FIG. 6 shows a series of illustrations which demonstrate the mechanisms of probe tip motion and stage motion.

Turning now to FIG. 5, series 500 shows in situ biasing of an example copper-zinc-tin-selenide (CZTSe) device. As such, the in situ biasing through the CZTSe device generates joule heating that degenerates the CZTSe crystals. A tungsten tip 504 may approach and contact a top electrode of the CZTSe cross-sectional sample 506 by a nano-manipulation component on a TEM holder (such as the TEM holder 202 of FIG. 2A). The tip is then biased under a constant voltage with the sample's Mo substrate grounded. The current that passes through the CZTSe film generates joule heating to the sample and triggers the in situ annealing, or even melting, as the temperature goes up. The entire process is done under TEM mode for that the frame rate can reach 400 fps for 512 by 512 resolution. After the annealing is done, EDS mapping is performed under STEM mode, and the elemental redistribution is analyzed. FIG. 5 (a) through (c) are TEM bright-field image of stage 1 through 3 during the in situ biasing of CZTSe. FIG. 5 (d) through (f) are enlarged TEM bright-field images of region 502 shown in FIG. 5(a). In this way, it may be possible perform in situ biasing experiments using the TEM holder that includes a STM probe integrated therewith.

As explained previously, the compact design of the STM subsystem made it possible to integrate an optical probe to the TEM holder to perform in situ optical probing experiments. The optical fiber may pass through a separate hole on the tip holder adjacent to the STM tip. At the back of the brass tubing the connector maybe modified to have both electrical and optical feedthroughs.

The TEM holder 602 may be integrated with an optical probe holder 604. The TEM holder 602 may feature a cylindrical housing 606 through which an optical fiber is extended into a TEM chamber. The TEM holder 602 is further coupled to an optical source 610. In one non-limiting example, the optical source 610 may be a laser coupled to the optical fiber. Specifically, the optical probe holder 604 includes an optical fiber 656 that is sealed inside a brass tubing 652 with an epoxy (e.g., Torr Seal Epoxy). In one non-limiting example, a 1 mm optical fiber may be sealed inside a 3/32" brass tubing. Light from the optical fiber 656 may be collimated onto a specimen mounted on a stage holder 654. In one example, a front surface of the optical fiber 656 may be coated with a clear epoxy to diffuse light and generate uniform illumination of the specimen. The stage holder 654 may one non-limiting example of the stage holder 204 described with reference to FIGS. 2A-C. A portion of the brass tubing 652 may be threaded so that additional optical element may be mounted on the brass tubing 652. In one example, the optical element may be one or more of a mirror, an objective lens, and a gradient index lens.

By coupling optical fiber 656 to the optical source, the wavelength of light may be easily adjusted by coupling different light sources to the TEM holder 602. As a result, optical responses to different materials that have various band gap and absorption spectrum may be measured using the TEM holder 602. In addition, the intensity of the light from the light source 610 can also be adjusted by changing the input power of the optical or light source 610. In situation where strong illumination is required, a high-power laser may be used as the light source 610. As such, the use of fiber optics reduces thermal drifting by removing the heat source during the generation of light from inside the holder to the outside environment so that there is no local heat source on the TEM holder 602. Knobs 612 and 614 may be used to adjust a distance of the optical fiber from the specimen mounted on the stage holder. O-rings 608 may be used to maintain vacuum sealing of the TEM holder 602. In this way, the optical fiber may be retracted during the loading/unloading of the sample from the sample holder.

In addition, the tip of the optical probe holder 604 may be composed of brass and aluminum which has a higher thermal conductivity relative to metal cladded ceramic board, for example. The heat that is caused by the localized illumination can be drained and the holder can become thermally stable in a shorter period of time. By using the optical fiber, light can be focused onto a specific region, which may result in a more uniform and efficient illumination condition. The use of fiber optics also provides the possibility of measuring photoluminescence (PL)/Raman signal by illuminating a laser with specific wavelength. By using a 1×2 fiber optic coupler and placing appropriate edge/notch filters between the spectrometer and the fiber, one can perfume in situ Raman measurements, and electron-beam-driven or photosensitive reactions can be characterized in real time. As an example, a spectrometer may be coupled to the TEM holder 602 using coupling electronics 616 (e.g., SMA electronics) for performing cathode luminescence (CL) measurements, as described below.

In this way, the TEM holders described herein have several advantages. For example, the double-tilt TEM holders integrated with double-tilt probe holders may be used to align the sample's zone axis with the electron beam so that the atomically resolved imaging may be possible while simultaneously performing in situ optical experiments such as CL measurement, optical excitation or biasing. The probe holders have increased stability and sensitivity so that, when combined with the double tilt stage of the sample holder, delicate experiment under high resolution may be performed. Since both the optical component and the STM component are modulated, it may be possible to combine both the optical holder and the STM holder into one TEM holder, thus making it possible to perform multiple in situ experiments simultaneously.

The present invention also features probe motion mechanism. As the linear stage moves along the x-y plane, the front end of the hollow tube moves to the opposite direction using the two seal-bearings as pivot points; when the stage moves along the z direction, the tube slides in the same direction against the front seal-bearing. The coarse and medium motions are realized by adjusting threaded knobs and differential adjusters, respectively, on the xyz linear stage, enabling the tip to be placed near the sample area of interest before final landing. In one embodiment, the sample stage can tilt 15 degree in both positive and negative directions, driven by a tilting rod, which is connected to a gear set for tilting angle control, sliding against the front seal-bearing.

In one embodiment, the present invention features a probe assembly (700) for a transmission electron microscope (TEM). In one embodiment, the probe assembly (700) may include a probe holder assembly (710), having a front end (712) and a rear end (714). In another embodiment, the probe assembly (700) may include a probe manipulator (720), coupled to the rear end (714) of the probe holder assembly (710). In another embodiment, the probe assembly (700) may include a probe (730), passing through an interior of the probe holder assembly (710) between the front end (712) and the rear end (714).

In some embodiments, the probe assembly (700) may include a front bearing (740), coupling the probe (730) with the probe holder assembly (710). As a non-limiting example, the front bearing (740) may comprise: a front insulating disk (742), having a through-hole (743) for the probe (730), the disk (742) being fixed in place within the probe holder assembly (710); an internal O-ring groove (744) around an inner circumference of the through-hole (743); and a front O-ring (745) inside the groove (744), configured to seal between the groove (744) and the probe (730). In one preferred embodiment the front O-ring (745) may have a deformation of about 8-10 percent when it is squeezed between the probe (730) and the groove (744). In another preferred embodiment the front O-ring (745) may have a deformation of about 1-2, 2-4, 4-6, 6-8, 10-12 or 12-14 percent when it is squeezed between the probe (730) and the groove (744).

In an embodiment, the probe assembly (700) may include a rear bearing (750), coupling the probe (730) with the probe manipulator (720). As a non-limiting example, the rear bearing (750) may comprise: a rear insulating disk (752), having a through-hole (753) for the probe (730), the disk (752) being fixed in place within the probe manipulator (720); an internal O-ring groove (754) around an inner circumference of the through-hole (753); and a rear O-ring (755) inside the groove (754), configured to seal between the groove (754) and the probe (730). In one preferred embodiment, the rear O-ring (755) may have a deformation of about 14-16 percent when it is squeezed between the probe (730) and the groove (754). In another preferred embodiment, the rear O-ring (755) may have a deformation of about 10-12, 12-14, 16-18, 18-20, or 20-22 percent when it is squeezed between the probe (730) and the groove (754).

In one embodiment, the front (740) and rear (750) bearings may each be configured to serve as a pivot point for motion of the probe (730) along an x axis and a y axis. In another embodiment, the front bearing (740) may allow for slide-through motion of the probe (730) along a z-axis. In another embodiment, the rear bearing (750) may not allow for slide-through motion of the probe (730) along a z-axis. In another preferred embodiment, the bearings (740, 750) may each be configured to serve as an electrically insulating vacuum seal with vibration dampening capability.

According to one embodiment, the probe (730) may be a scanning tunneling microscope (STM) probe. In another embodiment, the insulating disks (742, 752) may be round, oval, rectangular, square, or irregularly shaped. In another embodiment, the insulating disks (742, 752) may be polyether ether ketone (PEEK) disks. In another embodiment, the insulating disks (742, 752) may be fixed in place using epoxy or additional O-rings. In another embodiment, the (745, 755) O-rings may be low-degassing O-rings. In another embodiment, the (745, 755) O-rings may have a round, oval, square, rectangular, or irregular cross-sectional shape. In one embodiment, the (745, 755) O-rings may have a durometer hardness of about 17 on the Shore hardness scale. In another embodiment, the (745, 755) O-rings may have a durometer hardness of about 1, 2, 5, 7, 9, 10, 12, 14, 16, 18, 20, 22, or 24 on the Shore hardness scale.

In an embodiment, the probe manipulator (720) may be configured for coarse mechanical positioning of the probe (730). As a non-limiting example, the coarse mechanical positioning may be accomplished using hand knobs or electrical motors. In another embodiment, the probe manipulator (720) is further coupled to a piezo tube (725) configured for fine positioning of the probe (730).

According to one embodiment, the front bearing may comprise: a through-hole (743) for the probe (730) within the probe holder assembly (710); an internal O-ring groove (744) around an inner circumference of the through-hole (743); and a front O-ring (745) inside the groove (744), configured to seal between the groove (744) and the probe (730). As a non-limiting example, the through-hole (743) for the probe (730) may comprise a part of the probe holder assembly (710). According to another embodiment the rear bearing (750) may comprise: a through-hole (753) for the probe (730) within the probe manipulator (720); an internal O-ring groove (754) around an inner circumference of the through-hole (753); and a rear O-ring (755) inside the groove (754), configured to seal between the groove (754) and the probe (730). As a non-limiting example, the through-hole (753) for the probe (730) may comprise a part of the probe manipulator (720).

In some preferred embodiments, the rear bearing (750) may have a greater grabbing force on the probe (730) than the front bearing (740) has on the probe (730). In some embodiments, these grabbing forces may be due to friction between the probe and the O-rings. As a non-limiting example, the grabbing force of the rear bearing may be about 25 percent greater than the grabbing force of the front bearing. As other non-limiting examples, the grabbing force of the rear bearing may be about 1, 2, 5, 10, 15, 20, 30, 40, 50, 60, 70, 80, 90, 100, 120, 140, 160, 180, 200, 250, 300, 400, 500, or 1000 percent greater than the grabbing force of the front bearing.

In an embodiment, the front O-ring (745) may a deformation of about 8-10 percent when it is squeezed between the probe (730) and the groove (744), and the rear O-ring (755) may have a deformation of about 14-16 percent when it is squeezed between the probe (730) and the groove (754). In another embodiment, the front bearing (740) may allow for slide-through motion of the probe (730) along a z-axis. In another embodiment, the rear bearing (750) may not allow for slide-through motion of the probe (730) along a z-axis. In another embodiment, the front bearing (740) may comprise a front insulating disk (742), having the through-hole (743) for the probe (730), the disk (742) being fixed in place within the probe holder assembly (710). In yet another embodiment, the rear bearing (750) may comprise a rear insulating disk (753), having the through-hole (753) for the probe (730), the disk (742) being fixed in place within the probe manipulator (720).

In some embodiments, the present invention may feature a bearing (760) for a transmission electron microscope (TEM) probe. As a non-limiting example, the bearing may comprise: an insulating disk (762), having a through-hole (763) for the probe (730), the disk (762) being fixed in place within a probe holder assembly (710); an internal O-ring groove (764) around an inner circumference of the through-hole (763); and an O-ring (765) inside the groove (764), configured to seal between the groove (764) and the probe (730). In further embodiments the O-ring (765) may have a deformation of about 8-10 percent when it is squeezed between the probe (730) and the groove (764). In other embodiments the O-ring (765) may have a deformation of about 1-2, 2-4, 4-6, 6-8, 10-12, 12-14, 16-18, 18-20, or 20-22 percent when it is squeezed between the probe (730) and the groove (764).

According to one embodiment, the bearing (760) may be configured to serve as a pivot point for motion of the probe (730) along an x axis and a y axis and to allow for slide-through motion of the probe (730) along a z-axis. In another embodiment, the bearing (760) may be configured to serve as an electrically insulating vacuum seal with vibration dampening capability. In another embodiment, the O-ring (765) may be a low-degassing O-ring, having a durometer hardness of about 17 on the Shore hardness scale. In other embodiments, the O-ring (765) may be a low-degassing O-ring, having a durometer hardness of about 1, 2, 5, 7, 9, 10, 12, 14, 16, 18, 20, 22, or 24 on the Shore hardness scale. In a preferred embodiment, the insulating disk (762) may be a polyether ether ketone (PEEK) disk.

The following is a non-limiting example of the present invention. It is to be understood that said example is not intended to limit the present invention in any way. Equivalents or substitutes are within the scope of the present invention.

Example 1: Double-Tilt In Situ TEM Specimen Holder with STM and Optical Functions Functionality of Main Components The sample stage of the present invention features a double tilt function so that the HRTEM and atomic resolution STEM can be done on the thin film samples. The present invention also replaces stick-slip motion with a "wobble stick" component where the coarse motion is controlled by the linear stage that is mounted on the back of the holder. Additionally, the present invention replaces LEDs with a focusable $\phi$=1 mm fiber optics so that the fiber optics can be coupled with lasers of various wavelength and energy depending on the experiment. However, by introducing the new mechanism, the present invention features three components: double tilt stage, wobble stick, and fiber optics, that need to be individually sealed while still maintaining free motion. The present invention separates the holder into two components. One component is the double tilt holder with the fiber optics, and the other is the double tilt holder with the STM probing mechanism.

Double Tilt Stage

The double-tilt stage can be adjusted by the push rod that is located on the back panel of the holder, and the material used to connect the push rod and the sample stage is a super elastic wire made of NiTi alloy (Nitinol). The Nitinol wire is light, passive, highly elastic, and resistive to abrasion.

Optical Fiber

The conventional CL holder that Gatan supplies is a single-tilt holder with two single-mode fiber optics and two mirrors to collect the optical signals. The holder has a tight space and there is no way to add electrical components. A commercial fiber-based optical holder was previously available from NanoFactory. However, the probe's coarse motion is based on the concept of vibrational stick-slip motion and thus is very unpredictable.

For standard Cathodoluminescence (CL) spectroscopy, the light is emitted from the region that is irradiated by the electron beam. For simplification, it can be considered a point source. One of the biggest challenges is to collect as much of the emitted light as possible and couple the light into the fiber optics. For the 1 mm fiber optics of the holder, a maximum of 24.8 degree of acceptance angle can be achieved. This requires either the fiber optics to be close enough to the sample or coupled with additional optical elements. By using the lens system, the focal point can be adjusted on the sample so that the total amount of signal to be collected is maximized. The objective lens increases the acceptance angle for the fiber and helps capture the photons reflected by the mirror. The large diameter of the fiber optics can have a high acceptance angle. However, compared to using a thinner fiber, the light will be much less collimated when they enter a waveguide that has a larger cross-sectional area, as they come from a much more diverted angle, resulting a loss of photon both during the transportation inside the waveguide. To avoid such type of signal loss, the total length of fiber optics should be minimized.

Another factor that can impede the signal collection comes from the obstruction between the fibers, lenses, and patch cable connections. These loses of signal mainly come from the reflection when the light enters a media, which may be compensated by using optics that have anti-reflection coatings. But still, the best way to avoid such loss is to simplify the light path by reducing the total amount of the optical components or to project the collimated signal through free space.

Another critical component for the CL spectroscopy is the spectrometer. There are three major categories of detectors that can be used, including photomultiplier tubes (PMTs), avalanche photodiodes (APDs), and charge-coupled devices (CCDs). APDs and PMTs are much more sensitive than CCDs, however they can only measure the intensity of all light hitting them at the same time, thus a turret of diffraction grating is needed to separate the light with different wavelengths. This process increases the total form factor of the device and also significantly increases the acquisition time for a single spectrum. For CCDs, although the signal to noise ratio is smaller, the pixelated detector can acquire the entire spectrum at the same time. Hence for our application that require both portability and time resolution, an Ocean Optics QE Pro spectrometer was chosen for this application.

The optical component is made with a 1 mm fiber optics that is sealed inside a 3/32" brass tubing with Torr Seal epoxy. The front part of the tubing has a 3-80 thread for mounting additional optics such as a GRIN lens for coupling the light, an objective lens, and a mirror for better collection angle. On the back of the holder there is a knob to adjust the distance between the fiber optics and the sample stage. Such setup allows one to retract the fiber during the loading/unloading of the sample and adjust the focus of the light during the experiment to have the optimal signal strength.

In the preliminary stage of development, optical illumination was added to the NanoFactory holder by adding two LED's on the tip of the holder, which provided about 24 mcd of blue light. During the preliminary testing, limitations of such a setup were discovered. The sensitivity of electrical measurement is only at nA level, which is too low for in situ electrical experiments for ceramic materials; the illumination intensity is too low; the wavelength of the illumination can't be adjusted; and the thermal drifting takes place when the LED heated up the local region of the holder. Hence a better design was needed to solve these problems.

In the present invention, the LED light source is replaced by the fiber optics. By using the fiber optics as the light source, the wavelength can be easily adjusted by coupling different light source to the holder. This enables the experiment that require measuring optical responses to different materials that have various band gap and absorption spectrum. The intensity of the light can also be adjusted by change the input power of the light source. In the case that requires strong illuminations, a high-power laser can be used. For the thermal drifting issue, the use of fiber optics removes the heat source during the generation of light from inside the holder to the outside environment so that there is no local heat source on the holder. In addition, the tip of the holder is entirely made of brass and aluminum that when compared with the metal cladded ceramic board, has much higher thermal conductivity. The heat that is caused by the localized illumination can be easily drained and the holder can become thermally stable in a short period of time. By using the fiber optics, the light can also be focused onto a specific region, which can have a more efficient illumination condition than LEDs. The use of fiber optics also provides the possibility of measuring PL/Raman signal by illuminating a laser with specific wavelength. By using a 1×2 fiber optic coupler and placing appropriate edge/notch filters between the spectrometer and the fiber, one can perfume in situ Raman measurements, and electron-beam-driven or photosensitive reactions can be characterized in real time.

STM Component

The STM holder contains 3 separate subsystems, a mechanical coarse approach system, a piezo scanner for the fine motion/scanning, and a biasing/sensing component. The mechanical coarse motion uses a "wobble stick" design, where the entire tip assembly is assembled inside a brass tube that serves as a wobble stick. The wobble stick passes through an o-ring seal in the front part of the holder that serves as both a vacuum seal and a pivot point. The coarse tip motion is controlled by the mini linear stage that mounts on the back of the holder. When the stage moves to y+/z+ direction, the tip will be deflected towards y−/z− direction; when the stage moves along the x direction, the wobble stick will slide along the o-ring seal and move to the same direction. The differential adjuster screw allows has a 25 µm/rev resolution. When combined the reduction of the motion by having a pivot point at the o-ring seal, the coarse motion resolution can achieve 10 nm in y/z direction and 150 nm in x direction. FIGS. 2A-2C show the 3D design and photos of the STM holder. As can be seen from FIG. 3B, seven electrical wires, including five controlling the piezo tube and a twist pair of biasing/sensing cables pass through the ⅛" brass tubing, and are individually sealed at a specially designed feedthrough with vacuum epoxy.

The feedthrough component is sealed by o-ring against the wobble stick so that the entire interior of the wobble stick is under vacuum when the holder is inserted into the TEM. Such a back-sealing mechanism ensures insulation across the seven wires and provides for the possibility of modifying and repairing the electronic components. The time required for the holder to be pumped down to 10-5 torr is also significantly shorter compared to the design that pumps the entire interior of the holder. However, since the wires that we used is not vacuum compatible, the holder will slowly degas if left in the ambient condition for too long. This can be solved by a pump station to keep the holder in vacuum when not in use. At the current stage, the coarse motion is adjusted by the three differential screws on the linear stage.

The fine motion drive is a PZT piezo tube allowing sub-nanometer spatial resolutions for positioning and STM scanning within the TEM. The scan tube is mounted on an insulating base which connects it to the mechanical coarse motion system. The scan tube has four quartered electrodes and a center electrode and can be driven by any available SPM scan controller. In this example, the scanner was connected to a Nanosis SPM scan control system from SPECS. This allowed both fine positioning and STM scanning to be carried out. The scan tip is mounted in a copper cap, insulated from the piezo scan tube. The tip voltage and stage sense wires are carried by twisted pair shielded wire that is completely separated from the piezo drive electrics in order to prevent crosstalk between the scan and bias voltages. In order to effectively image single-crystal film specimens, a double-tilt holder is required. The tilt-stage is also actuated by a mechanical mechanism constructed in the same manner as the coarse-motion approach system. It should be noted that the majority of in-situ holders are single-tilt, and therefore unsuitable or difficult to use for high resolution imaging of thin film specimens which constitute the majority of electronic materials samples. The double-tilt system is driven by a rod arrangement mounted to another spring-loaded micrometer at the rear of the specimen rod. The fine motion is controlled by a ⅛" by ½" PZT tube. The exterior gold contact has been divided into 4 quadrants. These quadrants correspond to bending the PZT tube to x+, x−. y+ and y− directions.

The travel range of the fine motion is about 5 µm in y and z direction and 500 nm in x direction. Since the travel range of the fine motion is larger than the resolution of the coarse resolution, the tip can reach to any coordinate with the combination of the two systems. When performing the coarse motion by hands, however, some vibration is introduced to the tip through the screw. Such vibration makes the z-motion unstable because the resolution of the tip moving along x-y plane is about ten times higher than that along z-direction. One way to increase the stability of the coarse motion along z-direction is to increase the diameter of the knob. In doing so the torque that is applied to the screw is better controlled. Another way is to combine these knobs with piezo stacks. The combination of the micrometer and a piezo stack can achieve a much finer travel resolution in a larger scope. With the Thorlab PE4 adjuster, one can achieve 4 mm travel of coarse motion using a 0.01" pitch leadscrew, and 15 µm total travel of intermediate motion using the piezo stack. The introduction of a piezo stack fills the gap between the coarse and fine motion along the z-direction and hence makes the tip adjustment much easier.

The holder is compatible with the Nanosis SPM controller. When controlled by this controller, the holder can perform high sensitivity current measurement down to 10-11 A. Given such sensitivity, the holder is equipped with an automatic approaching mechanism that is controlled by the tunneling current feedback. When the tip is moved within the range of the piezo motor range, the system will expand the piezo tube when the tunneling current is low, meaning that the tip is still far from the sample; when the tunneling current exceeds a certain threshold, the piezo tube will contract to bring the current down, meaning that the tip has reached the sample.

Preliminary Results and Discussion

Cathodoluminescence Spectroscopy

The present invention may feature a setup for a CL measurement. On the back of the holder we used a compact CCD spectrometer from Ocean Optics. The holder and the spectrometer are coupled with SMA connectors. We have tested Gd2O2S: Tb(P43), Y2SiO5: Ce(P47), and Y+O3: Eu(P56) phosphor powder samples to test our CL signal. The average size of these samples is around 3 µm. And the acquisition time is 1 s. The signal is strong enough for the powder of this size range but is too weak for the actual TEM samples that are usually less than 100 nm. To improve the signal count, the holder should be coupled with PMT which has a better sensitivity. The acquisition time should be longer, and the new design of mirror should be introduced to increase the collection angle.

Optical Illumination

In the illumination experiment, instead of the spectrometer, the holder is coupled with a 50 mw 405 nm laser. The front side of the fiber optics is coated with a clear epoxy to diffuse the light for more uniform illumination. The sample stage is slightly tilted so that the fiber optics can illuminate the entire sample surface. The potential change at the interface has dropped from 1.2 V to 0.6 V when the illumination is turned on, which indicates that the ZnSe/CZTSe interface has attracted the excited electron and holes and thus such defect serves as recombination sites to reduce the efficiency of the device. It is worth note that due to the incoherence of the coupling between the holder, the fiber optic patch cable, and the laser, the total energy loss is significant. A more powerful laser and better coupling is needed to increase the illumination current density.

Besides the methods of increasing the source, one can also improve the illumination density by adding optics in the front in order to focus the light. The best way of doing that is to mount a gradient index (GRIN) optics. A GRIN optics is a type of optics that has a gradient refractive index alone the axial direction. The index is the highest in the center and it decreases as the radial distance increases. The ability of grin lenses to have flat surfaces drastically simplifies the design at the front of the fiber optics since it can be directly mounted on or fused to the front end of the optical fiber to produce collimated output. In this example, a collet was used to clamp a $\Phi=1$ mm GRIN lens on to the front end of the fiber optics assembly using the 3-80 thread on the exterior of the brass casing of the fiber. In combine with the front optics, the laser can be focus on different area of the sample by adjusting the knob located at the back of the holder. Such design doesn't require any adhesives or any permanent mounting methods such as fusing, so that the front optics can be taken off or swapped with other optics depending on the requirement of the illumination. For the CL spectroscopy use, the GRIN lens and its collet can be swapped with a polished aluminum mirror to increase the total collection angle of the CL signals.

STM Topography Mapping

STM mapping over a notch on the edge of a Cu film was performed. The topography information was calculated by recording the voltage applied to the piezo tube during the scanning process as the tip maintains the tunneling current of 100 nA. Using such technique, one can measure the film thickness by scanning the tip in the z direction, approach to the area of interest without the risk of touching/damaging the film and perform current mapping on a smooth region by turning the feedback off.

In Situ Biasing

The present example features a custom biasing holder to perform the in situ heating experiment. In this experiment, a tungsten tip is approached and contacted the top electrode of the CZTSe cross-sectional sample by a nano-manipulation component on the holder. The tip is then biased under a constant voltage with the sample's Mo substrate grounded. The current that passes through the CZTSe film generates joule heating to the sample and triggers the in situ annealing, or even melting, as the temperature goes up. The entire process is done under TEM mode for that the frame rate can reach 400 fps for 512 by 512 resolution. After the annealing is done, EDS mapping is performed under STEM mode, and the elemental re-distribution is analyzed.

FIG. 5 shows in situ biasing through the CZTSe device that generates joule heating that degenerates the CZTSe crystals. As the GBs are more conductive, the current density that went through these GBs will be much higher thus they start degenerating first (b, e). The grain interior will be heated up and degenerate in a later stage (c, f).

SUMMARY

In conclusion, the holders of the present invention have several unique capabilities. The double-tilt stage is designed to fit the UHR pole-piece gap for JEOL microscopes. This allows the sample's zone axis to be aligned with the electron beam so that the atomically resolved imaging can be achieved when the in situ experiment such as CL measurement, optical excitation or biasing is performed. The STM holder demonstrated very high stability and sensitivity so that, when combined with the double tilt stage, it can perform delicate experiment under high resolution. Since both the optical component and the STM component are modulated, they can be adapted to combine both into one holder. The holder with combined functions can do multiple in situ experiments simultaneously.

As used herein, the term "about" refers to plus or minus 10% of the referenced number.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A probe assembly (700) for a transmission electron microscope (TEM), the probe assembly (700) comprising:
   a. a probe holder assembly (710), having a front end (712) and a rear end (714);
   b. a probe manipulator (720), coupled to the rear end (714) of the probe holder assembly (710);
   c. a probe (730), passing through an interior of the probe holder assembly (710) between the front end (712) and the rear end (714);
   d. a front bearing (740), coupling the probe (730) with the probe holder assembly (710), the front bearing (740) comprising:
      i. a front insulating disk (742), having a through-hole (743) for the probe (730), the disk (742) being fixed in place within the probe holder assembly (710);
      ii. an internal O-ring groove (744) around an inner circumference of the through-hole (743); and
      iii. a front O-ring (745) inside the groove (744), configured to seal between the groove (744) and the probe (730), wherein the front O-ring (745) has a deformation of about 8-10 percent when it is squeezed between the probe (730) and the groove (744); and e. a rear bearing (750), coupling the probe (730) with the probe manipulator (720), the rear bearing (750) comprising:
  i. a rear insulating disk (752), having a through-hole (753) for the probe (730), the disk (752) being fixed in place within the probe manipulator (720);
  ii. an internal O-ring groove (754) around an inner circumference of the through-hole (753); and
  iii. a rear O-ring (755) inside the groove (754), configured to seal between the groove (754) and the probe (730), wherein the rear O-ring (755) has a deformation of about 14-16 percent when it is squeezed between the probe (730) and the groove (754);
wherein the front (740) and rear (750) bearings are each configured to serve as a pivot point for motion of the probe (730) along an x axis and a y axis, wherein the front bearing (740) allows for slide-through motion of the probe (730) along a z-axis,
wherein the rear bearing (750) does not allow for slide-through motion of the probe (730) along a z-axis, and
wherein the bearings (740, 750) are each configured to serve as an electrically insulating vacuum seal with vibration dampening capability.

2. The probe assembly of claim 1, wherein the probe (730) is a scanning tunneling microscope (STM) probe.

3. The probe assembly of claim 1, wherein the insulating disks (742, 752) are round, oval, rectangular, square, or irregularly shaped.

4. The probe assembly of claim 1, wherein the insulating disks (742, 752) are polyether ether ketone (PEEK) disks.

5. The probe assembly of claim 1, wherein the insulating disks (742, 752) are fixed in place using epoxy or additional O-rings.

6. The probe assembly of claim 1, wherein the (745, 755) O-rings are low-degassing O-rings.

7. The probe assembly of claim 1, wherein the (745, 755) O-rings have a round, oval, square, rectangular, or irregular cross-sectional shape.

8. The probe assembly of claim 1, wherein the (745, 755) O-rings have a durometer hardness of about 17 on the Shore hardness scale.

9. The probe assembly of claim 1, wherein the probe manipulator (720) is configured for coarse mechanical positioning of the probe (730).

10. The probe assembly of claim 1, wherein the probe manipulator (720) is further coupled to a piezo tube (725) configured for fine positioning of the probe (730).

11. A probe assembly (700) for a transmission electron microscope (TEM), the probe assembly (700) comprising:
  a. a probe holder assembly (710), having a front end (712) and a rear end (714);
  b. a probe manipulator (720), coupled to the rear end (714) of the probe holder assembly (710);
  c. a probe (730), passing through an interior of the probe holder assembly (710) between the front end (712) and the rear end (714);
  d. a front bearing (740), coupling the probe (730) with the probe holder assembly (710), the front bearing (740) comprising:
    i. a through-hole (743) for the probe (730) within the probe holder assembly (710);
    ii. an internal O-ring groove (744) around an inner circumference of the through-hole (743); and
    iii. a front O-ring (745) inside the groove (744), configured to seal between the groove (744) and the probe (730); and
  e. a rear bearing (750), coupling the probe (730) with the probe manipulator (720), the rear bearing (750) comprising:
    i. a through-hole (753) for the probe (730) within the probe manipulator (720);
    ii. an internal O-ring groove (754) around an inner circumference of the through-hole (753); and
    iii. a rear O-ring (755) inside the groove (754), configured to seal between the groove (754) and the probe (730);
  wherein the front and rear bearings (740, 750) are each configured to serve as a pivot point for motion of the probe (730) along an x axis and a y axis, wherein the bearings (740, 750) are each configured to serve as an electrically insulating vacuum seal with vibration dampening capability.

12. The probe assembly of claim 11, wherein the probe (730) is a scanning tunneling microscope (STM) probe.

13. The probe assembly of claim 11, wherein the rear bearing (750) has a greater grabbing force on the probe (730) than the front bearing (740) has on the probe (730).

14. The probe assembly of claim 11, wherein the front O-ring (745) has a deformation of about 8-10 percent when it is squeezed between the probe (730) and the groove (744), and the rear O-ring (755) has a deformation of about 14-16 percent when it is squeezed between the probe (730) and the groove (754).

15. The probe assembly of claim 11, wherein the front bearing (740) allows for slide-through motion of the probe (730) along a z-axis and wherein the rear bearing (750) does not allow for slide-through motion of the probe (730) along a z-axis.

16. The probe assembly of claim 11, wherein the front bearing (740) comprises a front insulating disk (742), having the through-hole (743) for the probe (730), the disk (742) being fixed in place within the probe holder assembly (710).

17. The probe assembly of claim 11, wherein the rear bearing (750) comprises a rear insulating disk (753), having the through-hole (753) for the probe (730), the disk (742) being fixed in place within the probe manipulator (720).

18. A bearing (760) for a transmission electron microscope (TEM) probe, the bearing comprising:
  a. an insulating disk (762), having a through-hole (763) for the probe (730), the disk (762) being fixed in place within a probe holder assembly (710);
  b. an internal O-ring groove (764) around an inner circumference of the through-hole (763); and
  c. an O-ring (765) inside the groove (764), configured to seal between the groove (764) and the probe (730), wherein the O-ring (765) has a deformation of about 8-10 percent when it is squeezed between the probe (730) and the groove (764);
  wherein the bearing (760) is configured to serve as a pivot point for motion of the probe (730) along an x axis and a y axis and to allow for slide-through motion of the probe (730) along a z-axis, and
  wherein the bearing (760) is configured to serve as an electrically insulating vacuum seal with vibration dampening capability.

19. The bearing of claim 18, wherein the O-ring (765) is a low-degassing O-ring, having a durometer hardness of about 17 on the Shore hardness scale.

20. The bearing of claim 18, wherein the insulating disk (762) is a polyether ether ketone (PEEK) disk.

* * * * *